United States Patent
Watanabe et al.

(10) Patent No.: US 8,075,733 B2
(45) Date of Patent: Dec. 13, 2011

(54) PLASMA PROCESSING APPARATUS

(75) Inventors: Seiichi Watanabe, Houfu (JP); Naoki Yasui, Kudamatsu (JP); Susumu Tauchi, Shunan (JP); Yasuhiro Nishimori, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 546 days.

(21) Appl. No.: 12/240,293

(22) Filed: Sep. 29, 2008

(65) Prior Publication Data

US 2010/0043976 A1    Feb. 25, 2010

(30) Foreign Application Priority Data

Aug. 25, 2008  (JP) .................. 2008-215634

(51) Int. Cl.
*C23C 16/00* (2006.01)
*C23F 1/00* (2006.01)
*H01L 21/306* (2006.01)

(52) U.S. Cl. .. 156/345.41; 156/345.42; 118/723 MWM; 118/723 MR

(58) Field of Classification Search ............. 156/345.41, 156/345.42, 345.52; 118/723 MW, 723 MR, 118/725
See application file for complete search history.

(56) References Cited

U.S. PATENT DOCUMENTS

| | | | | |
|---|---|---|---|---|
| 4,877,509 A | * | 10/1989 | Ogawa et al. | ............ 204/298.37 |
| 5,003,152 A | * | 3/1991 | Matsuo et al. | ............ 219/121.59 |
| 5,804,033 A | * | 9/1998 | Kanai et al. | ..................... 216/69 |
| 5,874,706 A | | 2/1999 | Ishii et al. | |
| 6,921,724 B2 | * | 7/2005 | Kamp et al. | ................... 438/715 |
| 2002/0046706 A1 | * | 4/2002 | Tamura et al. | ............... 118/728 |
| 2002/0148564 A1 | * | 10/2002 | Ishii et al. | ............... 156/345.41 |
| 2004/0244693 A1 | * | 12/2004 | Ishii et al. | ............ 118/723 MW |
| 2007/0209759 A1 | * | 9/2007 | Miya et al. | ............... 156/345.33 |

FOREIGN PATENT DOCUMENTS

| | | |
|---|---|---|
| JP | 62-53920 | 11/1987 |
| JP | 10-106796 | 4/1998 |
| JP | 10-107011 | 4/1998 |
| JP | 2005-101598 | 4/2005 |

OTHER PUBLICATIONS

Masamitsu Nakajima, Microwave Engineering (in Japanese), 91975), p. 67, Morimoto Publishing, Co., Ltd.

\* cited by examiner

*Primary Examiner* — Parviz Hassanzadeh
*Assistant Examiner* — Rakesh Dhingra
(74) *Attorney, Agent, or Firm* — Antonelli, Terry, Stout & Kraus, LLP.

(57) ABSTRACT

A plasma processing apparatus includes: a decompression chamber of which the inside is depressed; a gas supply unit that supplies process gas into said chamber; a microwave supply unit that supplies a microwave into the chamber to generate plasma; an object-placing electrode where a processing material, is placed and which holds the processing material in the chamber; and a vacuuming unit that is connected to the chamber to discharge the gas in the chamber, in which the chamber, a part for providing gas into the chamber of the gas supply unit, a part for introducing a microwave into the chamber of the microwave supply unit, the object-placing electrode, and the vacuuming unit are disposed coaxially with the center axis of the chamber, and the part for introducing a microwave includes a microwave rotation generator that rotates a polarization plane of the input microwave and supplies the microwave to the chamber.

5 Claims, 8 Drawing Sheets

TRAVELING DIRECTION OF RECTANGULAR MICROWAVE OF TE10 MODE RADIATED BY MAGNETRON

PLASMA PROCESSING APPARATUS

BACKGROUND OF THE INVENTION

1. Field of the Invention

The present invention relates to a plasma processing apparatus, particularly a plasma processing apparatus that can improve the uniformity of a processing surface of a wafer.

2. Description of the Related Art

A microwave plasma processing apparatus having a magnetic field for etching, for example, introduces a microwave into a decompression chamber through a wave guide and a cavity resonator, generates plasma in the chamber using interaction of the introduced microwave with a magnetic field produced by a magnetic field-producing coil, and etches processing objects, such as a wafer.

In general, the frequency of a microwave is 2.45 GHz and the microwave travels, in a circular TE11 mode, through the wave guide and is introduced into the chamber. The electric field of the microwave of the circular TE11 mode is distributed in an elliptical shape, as disclosed in 'Microwave Engineering' by Nakajima Masamitsu, published by Morimoto Publishing Co. Ltd. In 1975 (in P67). Further, a vacuuming unit that vacuums the chamber, as disclosed in JP-B No. S62-53920, is connected with an exhaust duct disposed under the chamber to extract gas only from one side of the exhaust duct. In this configuration, even though process gas is uniformly introduced into the chamber by a shower plate disposed above the chamber, biased flows of the gas are caused on a wafer.

As described above, since the strength of the electric field of the microwave of the circular TE11 mode is distributed in the elliptical shape, the plasma is correspondingly distributed in an elliptical shape. Therefore, there is a problem in that the etching rate is distributed in the elliptical shape. Meanwhile, in JP-B No. S62-53920, it is disclosed to improve the uniformity in a process by rotating the microwave electric field using a dielectric plate.

Further, the biased flows of the process gas on the waver by the exhaust only from one side is disclosed in JP-A No. 2005-101598, in which it is disclosed to improve the problem of biased flows of the process gas on the wafer by disposing a vacuuming device under a chamber and extracting the process gas uniformly. Further, in this example, the microwave is not introduced into the chamber through a circular wave guide, but a UHF wave is introduced into the chamber through a coaxial wave guide.

FIG. 9 is a vertical cross-sectional view of a plasma processing apparatus in the related art. As shown in FIG. 9, a microwave having a 2.45 GHz wave radiated by a magnetron 1 is transmitted, in a rectangular TE10 mode, into a rectangular wave guide 2 through an isolator, a power monitor, and a matching box 3, which are not shown in the figure. The microwave is further transmitted, in a circular TE11 mode, into a circular wave guide 41 through a spherical-rectangular transducer 21 and then introduced into a chamber 8 through a cavity resonator 5, a quartz plate 6, and a quartz-made shower plate 7.

The process gas for etching flows through a gas pipe 9 through a mass flow controller, which is not shown in the figure, and passes between the quartz plate 6 and the quartz-made shower plate 7, and the introduced into the chamber 8 through a gas hole of the quartz-made shower plate 7. The process gas that has flowed in the chamber 8 is decomposed and plasma is made by interaction of the microwave with the magnetic field while the inside pressure of the chamber 8 is adjusted by an exhaust speed-varying valve 10. The process gas in the chamber is discharged by a vacuuming device 14 through an exhaust duct 12, an on-off valve 13, and the exhaust speed-varying valve 10 disposed at a side of a wafer-placing electrode 11.

SUMMARY OF THE INVENTION

Etching reaction is performed by projecting radical, ion and etc. onto a wafer which is an object to be processed. Therefore, the entire etching rate depends on the processing conditions, for example, the amount of radical, the amount of ion, or ion energy. Because the distribution of radical and the ion does not uniformly influence the distribution of the etching rate, it is not necessary that the uniformity of etching is deteriorated and axial symmetry of the etching rate cannot be obtained, when the microwave of the circular TE11 mode and the exhaust duct extracting gas only from one side are used. Further, the effect of improving the uniformity of the etching rate or the axial symmetry achieved by rotating the microwave electric field or making the gas flow uniform has not been apparently known.

Recently, integration of semiconductor devices has been improved and microfabrication, that is, machining accuracy has been required, while it has been more strictly required to improve uniformity of the etching rate or uniformity of a CD (Critical Dimension) in the machining dimensions on the wafer.

Further, etching materials are changed from single layers to multi-layers and a multi-step etching that changes the etching conditions in processing the layers or each layer has been widely used. In this method, because the factors that influence the uniformity of etching, etc. are different for each step, it is difficult to achieve uniformity of etching and axial symmetry when etching of each multi-layer is finished.

As described above, JP-B No. S62-53920 discloses rotating a microwave electric field, but does not disclose a configuration for disposing a dielectric material, which is used in a mode converter for rotation, in a wave guide. It is difficult to obtain sufficient effect of rotating the microwave from only disposing a dielectric material for rotating the microwave, under a circumstance that a plurality of microwave modes exists as in JP-B NO. S62-53920.

The principle of microwave rotation using the dielectric material is based on, when a microwave having vertical and horizontal components with respect to the dielectric plate is introduced, the relationship between the rotational efficiency of the microwave and a phase difference of each component in a cross section perpendicular to the axis of the wave guide, as disclosed in 'Microwave Circuit' (in Pg. 217, by Suetake and Hayashi, published by Ohmsha Ltd. in 1966). In general, in wave guides having the same-sized cross sections, the wavelengths of the microwave are different when the modes of the microwave are different. For this reason, when a plurality of modes of microwave exists, it is difficult to design the most efficient microwave rotation because the phase differences are different for each mode after passing through the dielectric plate.

When the flow of the process gas on the wafer is biased to the exhaust duct 12 and the electric distribution of the microwave of circular TE11 mode is biased, the distribution of etching rate or the distribution of CD value, which can be obtained, are axially asymmetric, or the process is non-uniformly performed under a processing condition of microfabrication or multi-layer etching.

In order to overcome the above problems, the invention provides a plasma processing apparatus that is suitable for microfabrication by improving uniformity of the surface of a wafer shaped for etching.

The plasma processing apparatus of the invention includes: a decompression chamber of which the inside is depressed; a gas supply unit that supplies process gas into the decompression chamber; a microwave supply unit that supplies a microwave into the decompression chamber to generate plasma; an object-placing electrode where a processing material, which is an object to be processed, is placed and which holds the processing material in the decompression chamber; and a vacuuming unit that is connected to the decompression chamber to discharge the gas in the decompression chamber, in which the decompression chamber, a part for providing gas into the chamber of the gas supply unit, a part for introducing a microwave into the chamber of the microwave supply unit, the object-placing electrode, and the vacuuming unit are disposed coaxially with a center axis of the decompression chamber, and the part for introducing a microwave includes a microwave rotation generator that rotates a polarized surface of the input microwave and supplies the microwave to the chamber.

To achieve the above configuration, the invention provides a plasma processing apparatus that is suitable for microfabrication by improving uniformity of the surface of a wafer shaped for etching.

BRIEF DESCRIPTION OF THE DRAWINGS

Embodiments of the present invention will be described in detail based on the following figures, wherein.

DETAILED DESCRIPTION OF THE PREFERRED EMBODIMENTS

Figure 1:
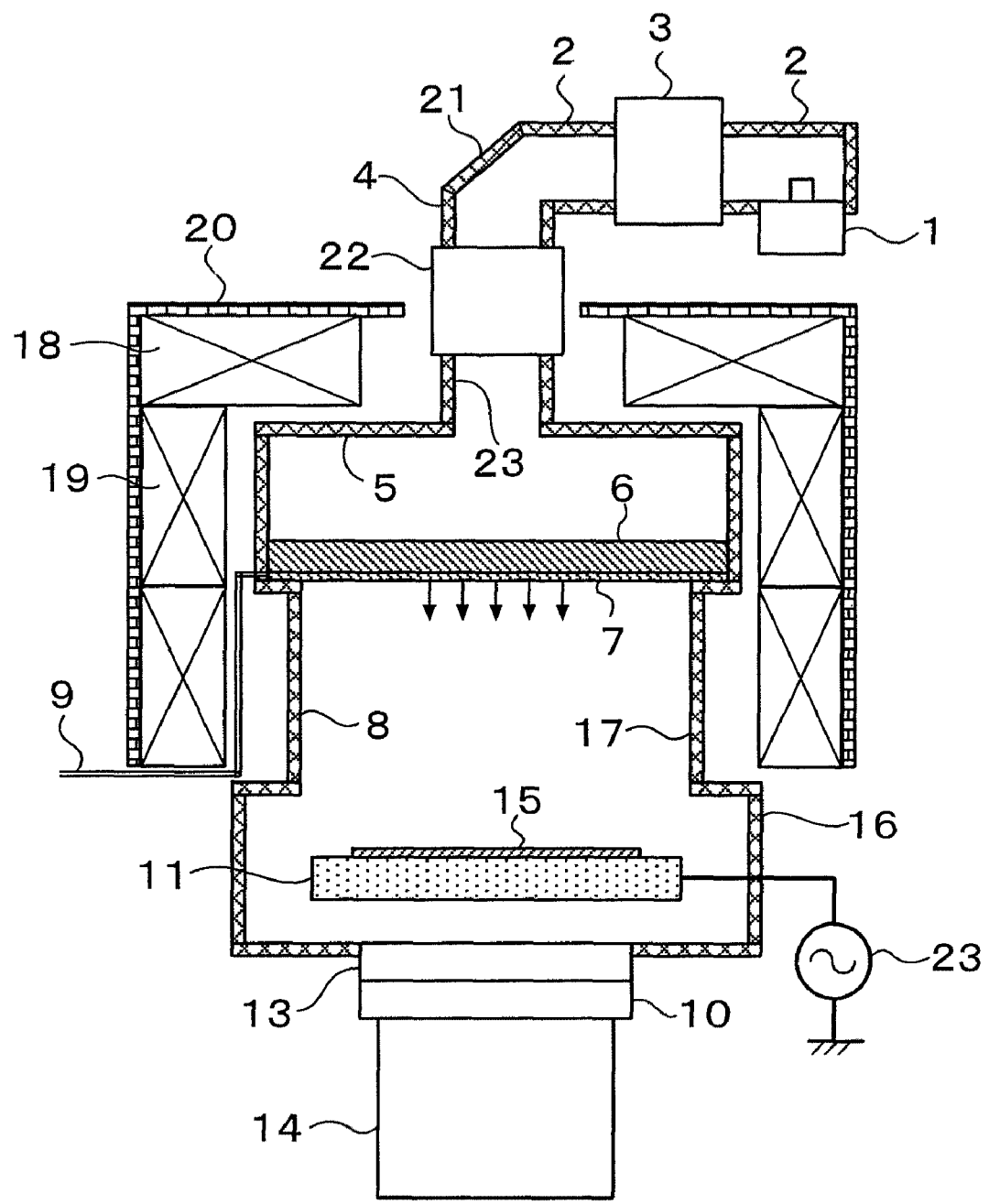
FIG. 1 is a view illustrating a plasma processing apparatus according to a first embodiment.

Preferred embodiments of the invention are described hereafter with reference to the accompanying drawings. FIG. 1 is a view illustrating a plasma processing apparatus (an apparatus equipped with a cavity resonator for dry-etching of a microwave having a magnetic field) according to a first embodiment of the invention. As shown in FIG. 1, a decompression chamber 8 is provided with a vacuum container 16, a discharge tube 17, and a quartz plate 6. The pressure inside the chamber 8 is decreased by actuating a vacuuming device 14 with an on-off exhaust valve 13 open.

Process gas such as etching gas, passes through a mass flow controller (not shown), a gas pipe 9, and a gap between the quartz plate 6 and a quartz shower plate 7, and then flows into the chamber 8 through gas holes of the quartz shower plate 7. The etching gas that has flowed in the chamber 8 is discharged through an exhaust speed-varying valve 10 adjusting the exhaust speed by the vacuuming device 14, such that the inside pressure of the chamber 8 is adjusted to a desired level by the exhaust speed-varying valve 10.

The chamber 8 exists in a magnetic field produced by coils 18, 19 and a yoke 20. A microwave, for example having a frequency of 2.45 GHz, radiated from a magnetron 1 travels, in a rectangular TE10 mode, into a rectangular wave guide 2 through an isolator (not shown), a power monitor (not shown), and a matching box 3 and then travels into a circular wave guide 4 through an spherical-rectangular transducer 21, in a circular TE11 mode. Thereafter, the microwave travels into a cavity resonator 5 through a microwave-rotating device 22 and a circular wave guide 23, and then travels into the chamber 8 through the quartz plate 6 and the quartz shower plate 7.

Further, circular wave guides having a size to allow a microwave of TE11 mode to travel are used for the circular wave guide 4, 23 disposed at the inlet and outlet of the microwave-rotating device 22.

A magnetic field area of magnetic flux density of 875 gauss that generates electron cyclotron resonance and a the microwave of 2.45 GHz traveling into the chamber 8 are distributed over the entire surface in the chamber 8, perpendicular to the center axis of the chamber 8 and the inflow direction of the microwave, that is, in the cross-sectional direction with respect to the center axis of the chamber 8. The process gas is decomposed and plasma is generated by interaction of the microwave of 2.45 GHz and the magnetic field of 875 gauss, such that a wafer 15 placed on a wafer-placing electrode 11 is etched by the generated plasma.

Further, in order to control the etching shape of the wafer 15, a high-frequency power supply 23 is connected to the wafer-placing electrode 11 through the matching box (not shown), such that high-frequency voltage is applied by the power supply. Further, a chiller unit (not shown) is connected to the wafer-placing electrode 15, such that a temperature-controlled coolant is provided to the wafer-placing electrode to control the temperature of the wafer 15.

Further, the chamber 8, the wafer 15, and the wafer-placing electrode 15 are coaxially disposed. Furthermore, the portion, where the gas holes are formed to allow the etching gas to flow, of the quartz shower plate 7, the exhaust valve 13 of a vacuum exhaust part, the exhaust speed-varying valve 10, and the vacuuming device 14 are also disposed coaxially with the chamber 8. Accordingly, the gas flow is axially symmetric on the wafer 15. In addition, because the coils 18, 19 and the yoke 20 producing the magnetic field are also disposed coaxially with the chamber 8, the electron cyclotron resonance region of 875 gauss, which is a magnetic field profile in the chamber 8, is disposed coaxially with the chamber 8. Furthermore, because the circular wave guides 4, 23 and the cavity resonator 5 are also disposed coaxially with the chamber 8, the microwave that travels into the chamber 8 travels therein coaxially with the chamber 8.

As described above, the part for providing gas into the chamber of the gas supply unit, the part for introducing a microwave into the chamber of the microwave supply unit, the object-placing electrode, and the vacuuming unit are disposed coaxially with center axis of the decompression chamber. The magnetic field is coaxially generated with the chamber 8 and the microwave is introduced coaxially with the chamber 8, such that the plasma generated by interaction of the magnetic field with the microwave is generated coaxially with the chamber 8 and the wafer 15 and the electrons and ions in the plasma are transferred coaxially with the wafer 15. Further, because the flow of the etching gas is coaxial with the chamber 8, the radical generated by the plasma and the reaction product made by etching the wafer 15 are also introduced and exhausted coaxially with the wafer 15.

Figure 9:
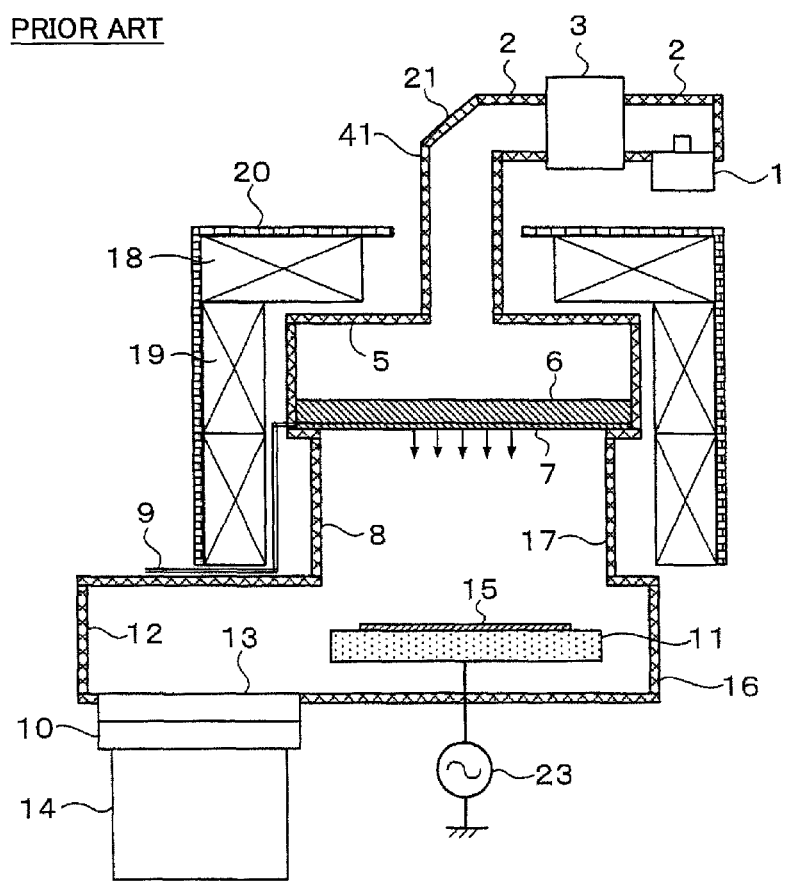
FIG. 9 is a vertical cross-sectional view of a plasma processing apparatus in the related art.

Therefore, uniformity of the wafer surface, such as the etching rate and the etching shape, is close to axial symmetry as compared to the related art shown in FIG. 9, and as a result, the uniformity of the surface is improved in processing the wafer.

According to the plasma processing apparatus in the related art shown in FIG. 9, a microwave of TE11 mode provided through a circular wave guide 4 is introduced into a chamber 1 through a cavity resonator 5. On the other hand, according to the plasma processing apparatus of this embodiment, a microwave of TE11 mode provided through the circular wave guide 4 is introduced into the microwave rotating generator 22, and then the microwave of TE11 mode that has been introduced is rotated and introduced into the chamber 8 through the circular wave guide 23 and the cavity resonator 5.

The cavity resonator 5 radially enlarges the electric field distribution of the microwave and stabilizes the electric field distribution of the microwave, which has an effect on improving uniformity in the plasma process and stabilizing the plasma.

The electric field of the microwave of TE11 mode is distributed in an elliptical shape; however, the electric field distribution of the microwave is axially symmetrically distributed by rotating the microwave of TE11 mode for a predetermined time. The generated plasma is also axially symmetrically distributed by introducing the microwave having axially-symmetric distribution into the chamber 8, such that the uniformity of the wafer surface is correspondingly improved.

There is a mode having axial electric field distribution, such as circular TM01 mode, in the modes of microwave. However, the circular TE11 modes used in this embodiment is a dominant mode, which is the safest. Therefore, it is possible to generate the most stable plasma by using the microwave of the circular TE11 mode. Further, it is possible to generate stable and uniform plasma by rotating the microwave of circular TE11 mode. Therefore, it is possible to apply very uniform and stable etching to the wafer 15.

Further, the effects by the gas flow coaxial with the chamber and rotation of the microwave have been obtained in accordance with requirements of micro-etching process, high accuracy of dimensions, and multi-layer etching. Further, the plasma processing apparatus of this embodiment is applicable to an etching process using chlorine-based gas, HBr-based gas, freon-based gas, rare gas, nitrogen gas, oxygen gas, and gas mixtures of them, and applicable etching materials are an organic material, such as BARC, an insulating layer material, such as $SiO_2$, SiON, SiN, Low-k, and High-k, αC (amorphous carbon), poly-Si, Si substrate, or metal.

Degree of the effects on the uniformity of the wafer surface by the gas flow coaxial with the chamber and rotation of the microwave depends on the gas for the etching process, the etching material, and required machining accuracy and uniformity.

For example, when uniformity of the wafer surface is ±10% or more, the coaxial gas flow and rotation of the microwave have minimal effect because the original uniformity of the wafer surface, which is the comparing object, is bad.

However, according to the apparatus having the exhaust duct 12 at only one side in the related art shown in FIG. 9, distribution on the wafer surface is biased toward the exhaust duct under a processing condition that the uniformity of the wafer surface is 10% or less. For this reason, as shown in FIG. 1, by making the coaxial gas flow, the biased distribution on the wafer surface is reduced, thereby improving the uniformity of the wafer surface.

The biased distribution on the wafer surface is reduced by making the coaxial gas flow. However, as shown in FIG. 1, when the microwave of circular TE11 mode is introduced as it is into the chamber 8, the electric field of the microwave that travels into the chamber 8 is affected by the elliptical distribution, such that the distribution of the wafer surface may be elliptically distributed. In this case, it is possible to achieve axially-symmetric distribution of the wafer surface in a variety of processes including the multi-layer etching by rotating the electric field of the microwave and then introducing it into the chamber 8, as shown in FIG. 1. Accordingly, the uniformity of the wafer surface of etching characteristics is improved. In particular, this is effective in gate etching after a 45 nm node requiring high uniformity of CD dimensions, in a multi-layer etching process.

Figure 2:
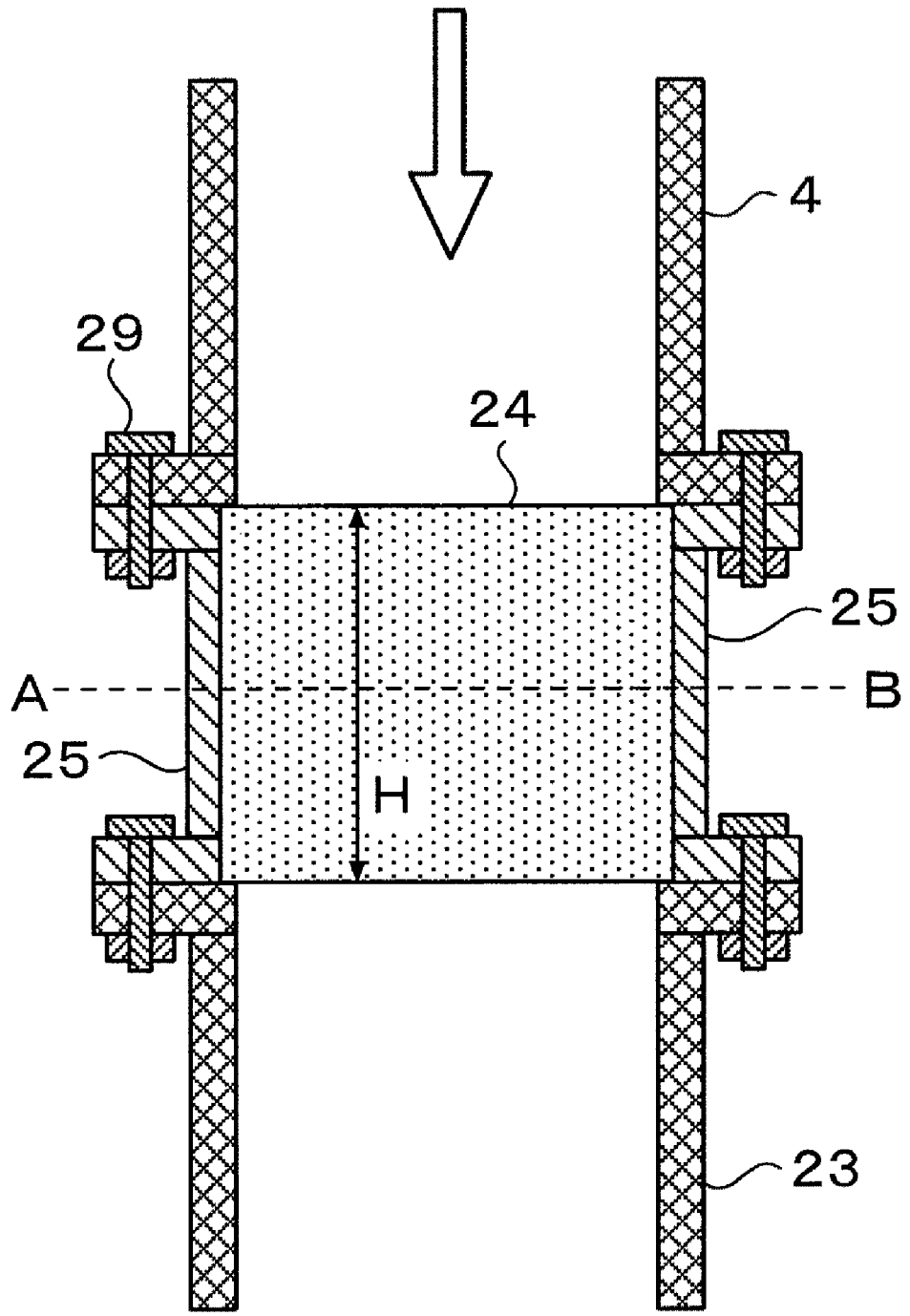
FIG. 2 is a view showing a vertical cross section of a microwave rotation generator.
Figure 3:
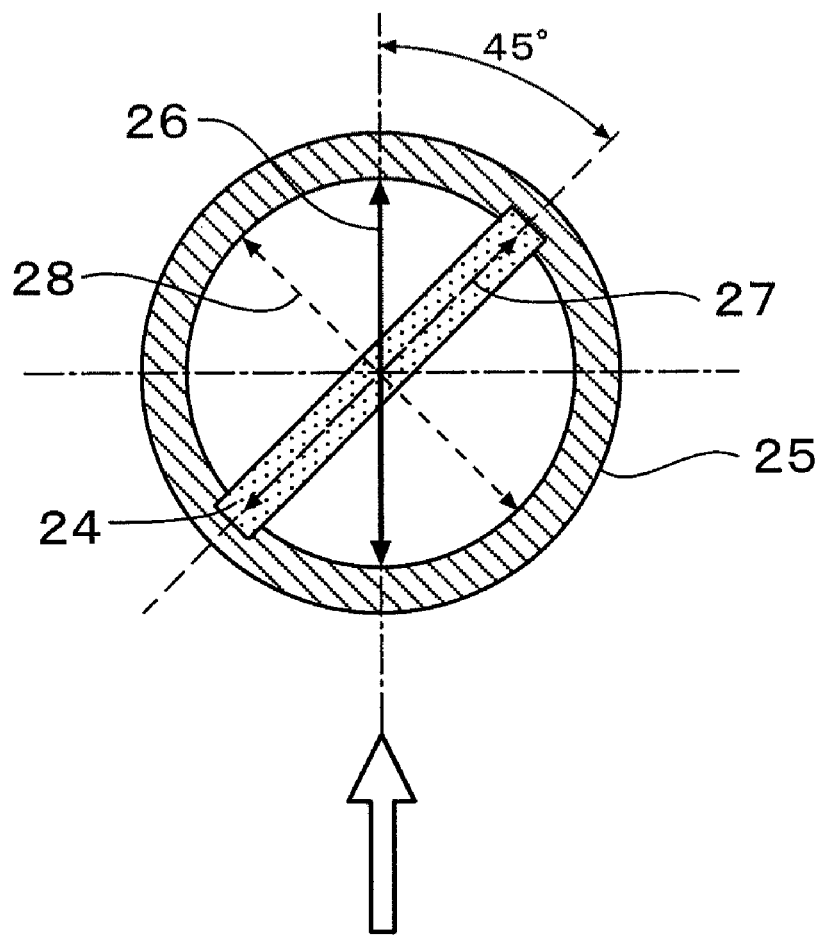
FIG. 3 is a cross-sectional view taken along the line A-B in FIG. 2.

The rotation of the electric field distribution of a microwave is described with reference to FIGS. 2, 3, and 4. FIG. 2 is a view showing the vertical cross section of the microwave rotation generator 22 and FIG. 3 is a cross-sectional view taken along the line A-B of FIG. 2.

The microwave rotation generator 22 is provided with a dielectric plate 24 and a conductive dielectric plate guide 25. In FIG. 2, the dielectric plate 24 is formed of a quartz plate (relative dielectric constant 3.8) and the dielectric plate guide 25 is formed of aluminum. A microwave is generated by the magnetron 1, travels, in a rectangular TE10 mode, through the rectangular wave guide 2 and then changed into a circular TE11 mode in the spherical-rectangular transducer 21. The main vibration direction of the electric field 26 of the microwave in the circular wave guide is the same as the traveling direction of the microwave in the rectangular wave guide 2 as shown in FIG. 3 and does not change as time passes (linearly-polarized wave). The dielectric plate 24 is positioned at 45° right from the main vibration direction of the electric field of the microwave. The electric field 26 of the microwave, which is a linearly-polarized wave, can be considered as composition of a horizontal electric field 27 and a perpendicular electric field 28 to the dielectric plate 24. Because a majority of the horizontal electric field 27 to the dielectric plate 24 passes through the center of the dielectric plate 24, it is greatly affected by the dielectric plate 24. Further, since the dielectric plate 24 has 1 or more relative dielectric constant, the wavelength of the microwave passing through the dielectric plate 24 is reduced. Meanwhile, the perpendicular electric field 28 to the dielectric plate 24 is not substantially affected by the dielectric plate 24, such that the wavelength of the microwave passing through the dielectric plate 24 is almost the same as the wavelength in the circular wave guide. When the microwave 26, which is a linearly-polarized wave, is introduced into the dielectric plate 24, that is, when the horizontal microwave electric field 27 and a perpendicular microwave electric field 28 to the dielectric plate 24 are simultaneously (in the same phase) introduced to the dielectric plate 24, the phases of the electric field of both microwaves become different because their wavelengths are different.

That is, the phase of horizontal electric field 27 to the dielectric plate 24 is delayed more than the phase of the perpendicular electric field 28. The phase delay is proportional to the length H of the dielectric plate 24. The length H of the dielectric plate 24 in the traveling direction of the microwave is set such that the phase difference of the horizontal electric field 27 and a perpendicular electric field 28 to the dielectric plate 24 is 90°. With the length H set as described above, a composite electric field of the horizontal electric field 27 and a perpendicular electric field 28 to the dielectric plate 24 rotates right as time passes (circularly-polarized wave). A rotational frequency of the microwave in this case is high, the same as the microwave having a frequency of 2.45 GHz.

Figure 4:
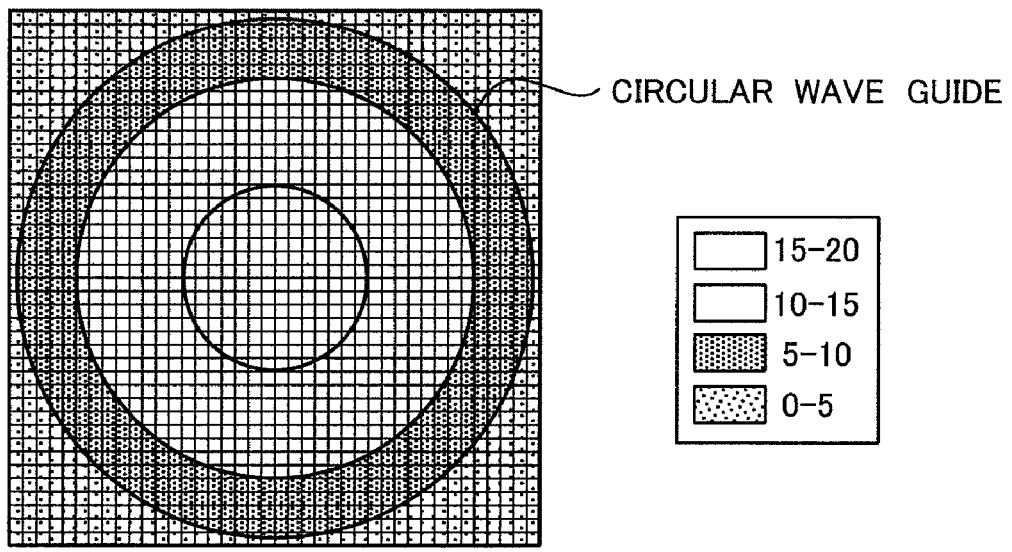
FIG. 4 is a view showing strength distribution of an electric field of a microwave, which is composed as time passes.

FIG. 4 is a view showing strength distribution of an electric field of a microwave composed as time passes, which is axially symmetric as shown in FIG. 4.

On the other hand, in FIG. 1, when the magnetic field is produced while the current direction provided to the coils 18, 19 is set such that the lines of magnetic force faces the lower portion (wafer-placing electrode) from the upper portion (the portion where the microwave is introduced) of the chamber 8, the electrons rotate right around the lines of the magnetic force. Since the electric field of the microwave rotates right as described above, the rotational directions of the electrons and the electric field of the microwave are the same. Therefore, the electrons are efficiently accelerated and the efficiency of generating plasma is improved.

The rotational efficiency of the microwave depends on the direction of the electric field 26 of the microwave, a linearly-polarized wave, introduced to the dielectric plate 24 and angle from the horizontal direction with the dielectric plate 24, and is the best right at 45° shown in FIG. 3 (however, this is obtained when there is little reflection of the microwave from the dielectric plate 24 and the reflection is not considered, and it needs to modify the angle when the reflection is considered).

Further, when the dielectric plate 24 is disposed at an angle to the left from the electric field 26 of the microwave, which is a linearly-polarized wave, the electric field of the microwave composed after passing through the dielectric plate 24 rotates left around. The rotational efficiency is the best when the angle is −45°. However, when the lines of magnetic force faces the lower portion from the upper portion of the chamber 8, the rotational direction of the electric field of the microwave is opposite to the rotational direction of the electrons, such that the efficiency is decreased in generating plasma. Therefore, in the above case, it is preferable to produce the magnetic field after setting the current direction of the coils 18, 19 and the magnetic field such that the lines of magnetic force face the upper portion (the portion where the microwave is introduced) from the lower portion (wafer-placing electrode) of the chamber 8.

As shown in FIG. 2, the sides of the microwave rotation generator 22 through which the microwave is introduced and travels outside are connected by the circular wave guides 4, 23 and bolts 29. The dielectric plate guide 25 of the microwave rotation generator 22 is a cylindrical guiding member having axially-symmetric grooves in which the dielectric plate 24 is inserted and the distance between the bottoms of the axially-symmetric grooves is larger than the inner diameter of the circular wave guides 4, 23 connected with the dielectric plate guide 25. Therefore, it is possible to easily and simply position the dielectric plate 24 by only inserting the dielectric plate 24 into the grooves of the dielectric plate guide. Further, since the dielectric plate guide 25 and the circular wave guides 4, 23 are connected together by the bolts 29, it is possible to maintain the positioning angle of the dielectric plate guide 25.

Further, the inner diameters of the circular wave guides 4, 23 are set to allow only the microwave of a circular TE11 mode to travel, i.e. 71.8 to 93.7 mm. Accordingly, it is possible to rotate the microwave of circular TE11 mode. The inner diameter of the dielectric plate guide 25 is set to allow only the microwave of circular TE11 mode to travel, i.e. 71.8 to 93.7 mm. Accordingly, it is possible to prevent a plurality of modes, other than the circular TE11 mode, from being generated at the region where the dielectric plate guide 25 is inserted, and introduce the microwave of the circular TE11 mode into the chamber 8 by rotating it.

Figure 5:
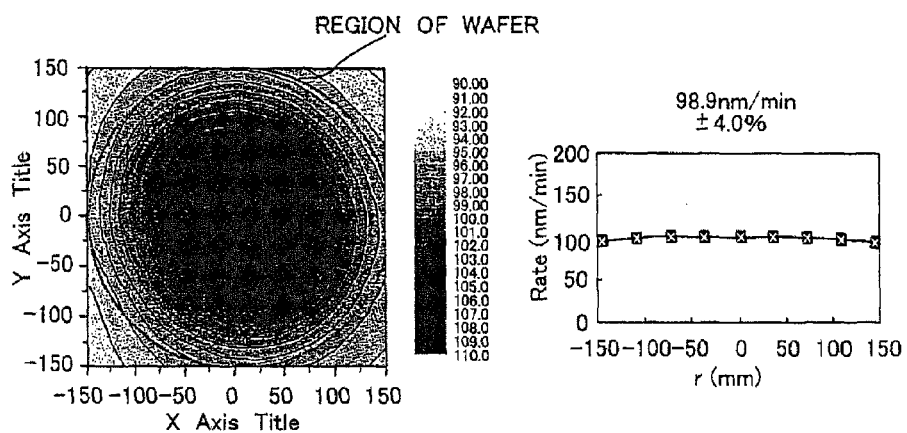
FIG. 5 is a view showing the distribution of an etching rate on a wafer, which can be obtained in the related art.

FIG. 5 is a view showing distribution of a wafer surface of an etching rate that can be obtained by etching poly-Si when gas flow is axially symmetric and a microwave of a circular TE11 mode is introduced (related art). Further, the etching gas is a gas mixture of HBr, $Cl_2$, and $O_2$.

In general, when the gas flow on the wafer 15 is biased by the vacuuming device disposed at one side of the vacuum duct, the distribution of the wafer surface of the poly-Si etching rate is highly uniform under about ±10%, the biased distribution that influences the gas flow can be seen. In particular, for high uniformity under about ±5%, it can be easily seen. As shown in FIG. 5, when the gas flow is axially symmetric, the etching rate is 98.9 nm and the uniformity is ±4.0%, such that it is difficult to see the biased distribution influencing the gas flow. However, it can be seen that the distribution of the wafer surface of the etching rate is an elliptical distribution.

Figure 6:
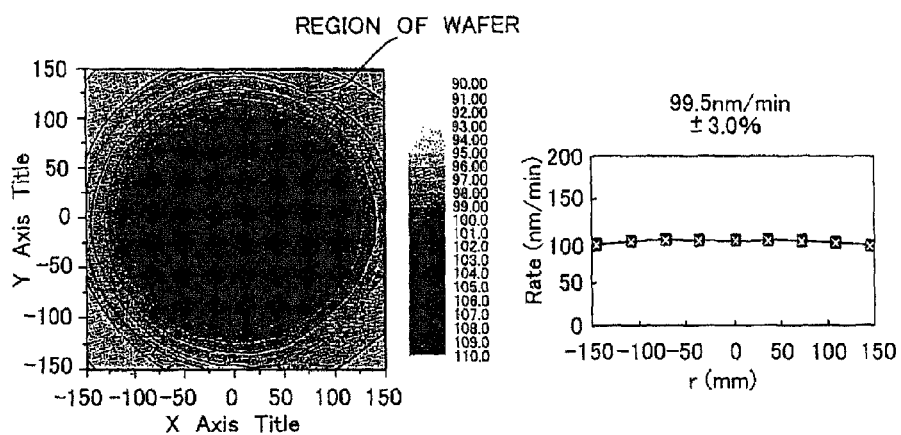
FIG. 6 is a view showing the distribution of an etching rate on a wafer when electric field distribution of a microwave is rotated.

FIG. 6 is a view showing distribution of a wafer surface of a poly-Si etching rate under the same process condition as when electrical field distribution of a microwave is rotated by the microwave rotation generator 22. In this embodiment, the etching rate is slightly increased to 99.5 nm/min and uniformity is improved to ±0.3%. It can be seen that the uniformity of the wafer surface of the etching rate is improved to be axially symmetric.

Improvement of the distribution of the etching rate is described above; however, it is the same as in the etching process dimension (CD value) or uniformity of a wafer surface shaped for the process. That is, according to this embodiment, it is possible to axially symmetrically distribute the etching characteristics including the etching rate, the process dimension, and the process shape, and improve the uniformity of the wafer surface.

Further, in FIG. 1, though not shown in the figure, an electrostatic adsorption layer is provided on the surface of the wafer-placing electrode 11 and DC power is connected to the wafer-placing electrode 11 through a filter, such that the wafer 15 is electrostatically-adsorbed to the wafer-placing electrode 11. Further, cooling He gas is provided to the other side of the wafer 15 from the wafer-placing electrode 11. The wafer-placing electrode 11 has a groove through which the coolant circulates and a chiller unit (not shown) is connected to the groove.

The temperature of the wafer 15 is controlled by adjusting the temperature of the coolant. The temperature of the wafer is important because etching is a chemical reaction. Temperature sensitivity of the etching characteristics, including the etching rate and the etching shape, depends on the processing conditions, such as etching gas, flow rate, pressure, output of a microwave, and output of a high-frequency bias; however, for example, the temperature sensitivity is about 1 nm/° C. at the CD value in the poly-Si etching.

Figure 7:
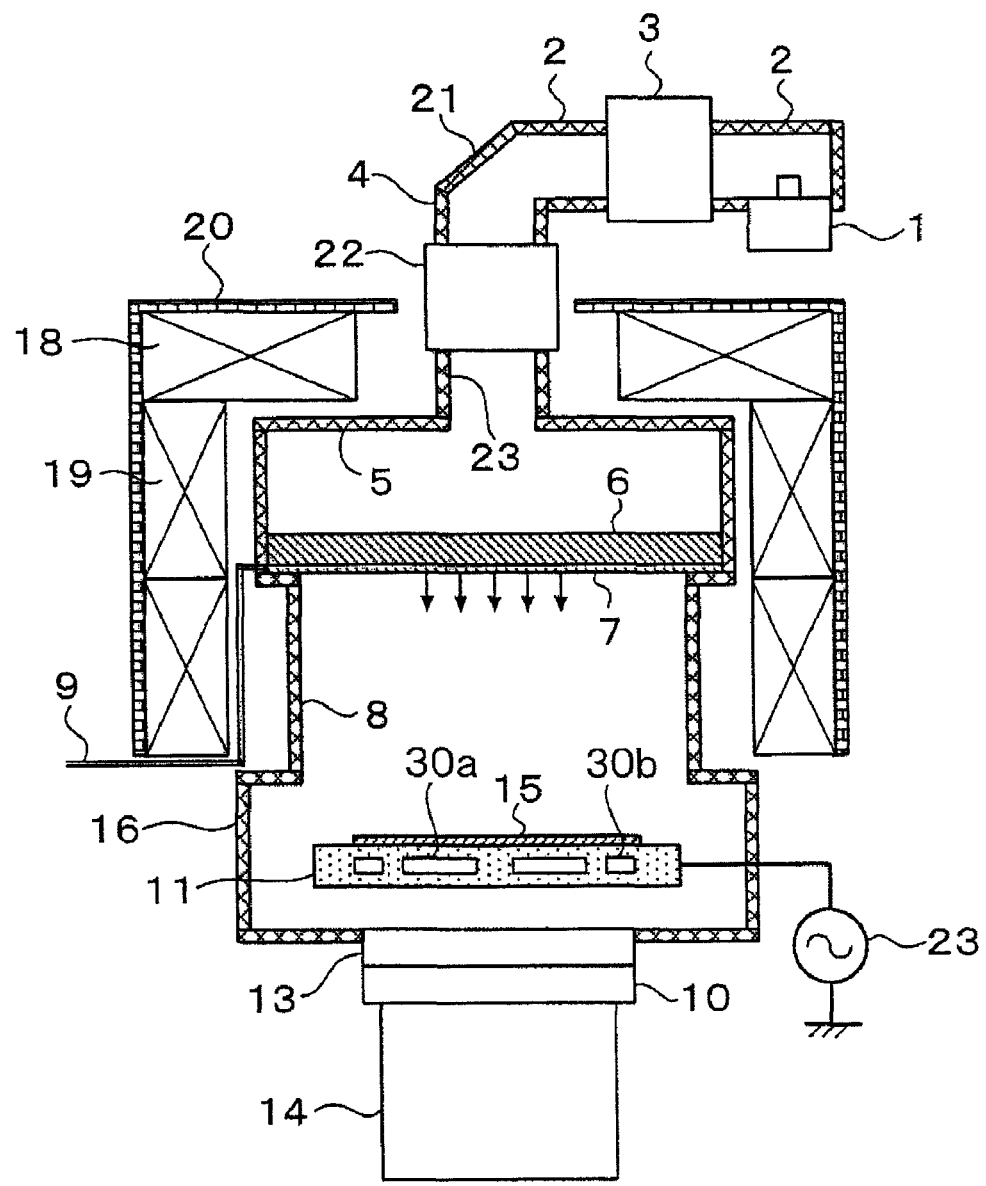
FIG. 7 is a view illustrating a plasma processing apparatus according to a second embodiment.

FIG. 7 is a view illustrating an apparatus equipped with a cavity resonator for dry-etching of a microwave having a magnetic field according to a second embodiment. In this example, separate coolant grooves 30a, 30b are formed on the inside and the outside of the wafer-placing electrode 11 as shown in FIG. 7, coolant is provided to the coolant grooves through separate chiller unit. Accordingly, it is possible to control temperature distribution over the surface of the wafer 15. In this embodiment, the electrode including the coolant grooves 30 is formed such that the temperature distribution of the wafer 15 is axially symmetric.

With the axially-symmetric gas flow and the electric field distribution of a microwave on the wafer 15, the etching characteristics including the CD value can be axially symmetrically distributed. Further, supposing that the temperature of the wafer is axially symmetrically distributed, radial direction temperature distribution of the wafer can be controlled. In this case, it is possible to improve the etching characteristics including the CD of the wafer surface to be more uniform and achieve very uniform etching characteristics by controlling the radial temperature distribution of the wafer 15 using two chiller units (not shown), if examining in advance the temperature sensitivity of the etching characteristics including an applying processing condition and CD corresponding to the etching material.

Figure 8:
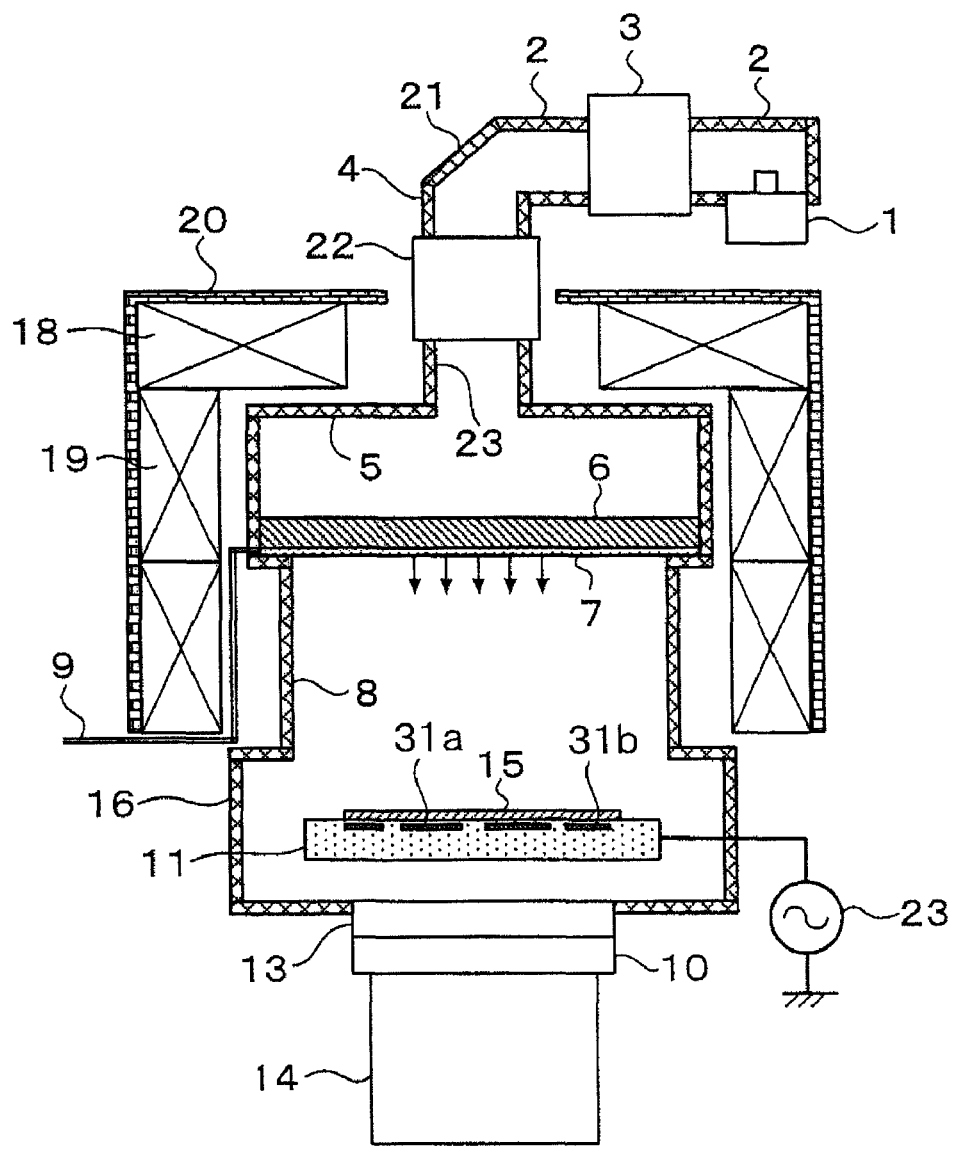
FIG. 8 is a view illustrating a plasma processing apparatus according to a third embodiment.

FIG. 8 is a view illustrating an apparatus equipped with a cavity resonator for dry-etching of a microwave having a magnetic field according to a third embodiment. In this embodiment, heaters 31a, 31b are embedded in the inside and outside of the wafer-placing electrode 11 such that the temperature of the wafer 15 is axially symmetrically distributed and the heaters are connected to heater power supplies (not shown). Further, a coolant groove (not shown) is formed on the wafer-placing electrode 11 and a chiller unit (not shown) is connected to the coolant groove. Therefore, it is possible to improve time response to the temperature of the wafer.

In etching a multi-layer, etching conditions should be sequentially changed for each layer of the multi-layer; however, it is possible in this embodiment to optimize the temperature distribution or the absolute temperature of the wafer 15 at each etching step, easily improve the uniformity of the surface of the wafer 15 in the etching characteristics including the CD, and achieve very uniform etching characteristics.

Although an apparatus equipped with a cavity resonator for dry-etching of a microwave having a magnetic field is exemplified in the above, the invention can be applied to other plasma processing apparatuses using a microwave, such as a plasma CVD device, an ashing device, and a surface-machining device.

As described above, according to the embodiments of the invention, the wafer 15, which is the processing material, the chamber 8, the part for introducing gas into the chamber 8, the vacuuming part of the chamber 8, and the part for introducing a microwave into the chamber 8 are axially symmetrically disposed, and a mechanism rotating the electric field of a microwave introduced is provided. Further, the wave guide connected to the mechanism rotating the electric field of a microwave has a cross-sectional area that allows only the circular TE11 mode to be transmitted. Furthermore, the microwave rotation generator is provided with the rectangular dielectric plate and the cylindrical dielectric plate guide having axially-symmetric grooves for receiving and supporting the dielectric plate, and the diagonal distance (largest distance) between the grooves formed on the dielectric plate guide is larger than the inner diameter of the circular wave guide connected with the microwave rotation generator.

Therefore, the uniformity of the wafer surface shaped for etching is improved, such that it is possible to easily achieve a plasma processing apparatus for microfabrication or etching a multi-layer.

What is claimed is:

1. A plasma processing apparatus comprising:
a decompression chamber of which the inside is decompressed;
a gas supply unit that supplies process gas into the decompression chamber;
a microwave supply unit that supplies a microwave into the decompression chamber to generate plasma;
at least one coil forming a magnetic field in the decompression chamber;
an object-placing electrode where a processing material, which is an object to be processed, is placed and which holds the processing material in the decompression chamber; and
a vacuuming unit that is connected to the decompression chamber to discharge the gas in the decompression chamber;
wherein the decompression chamber, a part for providing gas into the chamber of the gas supply unit, a part for introducing a microwave into the chamber of the microwave supply unit, the at least one coil, the object-placing electrode, and the vacuuming unit are disposed coaxially with a center axis of the decompression chamber;
wherein the part for introducing a microwave includes a microwave rotation generator provided with a rectangular dielectric plate and a cylindrical dielectric plate guide having axially-symmetric opposing grooves therein for receiving and supporting the rectangular dielectric plate, the microwave rotation generator having a cross-sectional dimension enabling only the microwave of TE 11 mode to be transmitted, wherein a distance between bottoms of the opposing grooves of the cylindrical dielectric plate guide is larger than an inner diameter of a circular wave guide connected with the cylindrical dielectric plate guide of the microwave rotation generator; and
wherein a polarization plane of the input microwave is rotated right or left, thereby, the microwave of the TE 11 mode being generated, the generated microwave of TE 11 mode being supplied to the decompression chamber through the circular waveguide exclusively having a dimension enabling the generated microwave of TE 11 mode transmitted.

2. The plasma processing apparatus according to claim 1, wherein the object-placing electrode has coolant grooves that are disposed coaxially with a center axis of the object placing electrode to allow a coolant to flow.

3. The plasma processing apparatus according to claim 1, wherein the object-placing electrode has heaters that are disposed coaxially with a center axis of the object placing electrode to heat the object.

4. The plasma processing apparatus according to claim 1, wherein a rotational direction of the polarization plane of the microwave and a rotational direction of electrons generated by the microwave and the magnetic field around lines of a magnetic force are the same.

5. The plasma processing apparatus according to claim 1, wherein an inner diameter of the cylindrical dielectric plate guide is smaller than the distance between the bottoms of the opposing grooves of the cylindrical dielectric plate guide.

* * * * *